United States Patent
Vogelsang

(10) Patent No.: US 7,293,190 B2
(45) Date of Patent: Nov. 6, 2007

(54) NOISY CLOCK TEST METHOD AND APPARATUS

(75) Inventor: Thomas Vogelsang, Jerich, VT (US)

(73) Assignee: Infineon Technologies AG, Munich (DE)

( * ) Notice: Subject to any disclaimer, the term of this patent is extended or adjusted under 35 U.S.C. 154(b) by 514 days.

(21) Appl. No.: 10/720,437

(22) Filed: Nov. 24, 2003

(65) Prior Publication Data

US 2005/0110523 A1    May 26, 2005

(51) Int. Cl.
*G06F 1/04* (2006.01)
*G06F 1/00* (2006.01)
*G06F 1/12* (2006.01)
*H03K 19/00* (2006.01)
*H03K 19/096* (2006.01)

(52) U.S. Cl. ............... 713/600; 713/500; 713/601; 326/93; 326/96

(58) Field of Classification Search ............ 713/600
See application file for complete search history.

(56) References Cited

U.S. PATENT DOCUMENTS 6,278,652 B1 *  8/2001  Katsuhisa ............. 365/233
2003/0226054 A1 * 12/2003  Benno et al. .......... 713/500

OTHER PUBLICATIONS

Merriam-Webster's Collegiate Dictionary, Tenth Edition, 1999, p. 1298.*

* cited by examiner

*Primary Examiner*—Rehana Perveen
*Assistant Examiner*—Stefan Stoynov
(74) *Attorney, Agent, or Firm*—Slater & Matsil, L.L.P.

(57) ABSTRACT

A clock filter for use in filtering an external clock signal to create an internal clock signal for use by an electronic device is provided. The clock filter receives the external clock signal and sets the internal clock signal high when the external clock signal is above a first threshold and sets the internal clock signal low when the external clock signal is below a second threshold. The clock filter holds the internal clock signal constant for a period of time after the clock transitions.

20 Claims, 6 Drawing Sheets

| TMslowslope | CLOCK ENABLE | A | B | C |
|---|---|---|---|---|
| 0 | 0 | 0 | 1 | 0 |
| 1 | 0 | 0 | 1 | 0 |
| 0 | 1 | 0 | 1 | 1 |
| 0 | 1 | 1 | 1 | 1 |
| 1 | 1 | 0 | 1 | 1 |
| 1 | 1 | 1 | 0 | 0 |

| TMslowslope | CLOCK ENABLE | A | B | C | D |
|---|---|---|---|---|---|
| 0 | 0 | 0 | 1 | 0 | 0 |
| 1 | 0 | 0 | 1 | 0 | 0 |
| 0 | 1 | 0 | 1 | 0 | 1 |
| 1 | 1 | 0 | 1 | 0 | 1 |
| 1 | 1 | 1 | 0 | 1 | 0 |

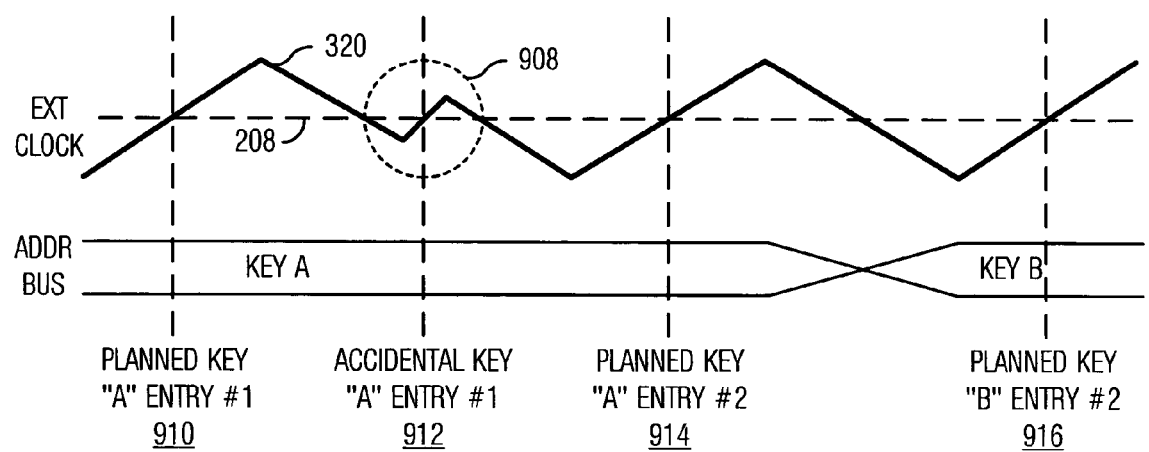

NOISY CLOCK TEST METHOD AND APPARATUS

TECHNICAL FIELD

The present invention relates generally to electronic devices, and more particularly to electronic devices using an external clock.

BACKGROUND

Electronic devices are frequently driven by a clock signal. The clock signal provides a timing signal that causes electronic components to perform specific actions. For example, clock signals are frequently used by logic circuits to control the timing of reads and writes to memory devices, such as dynamic random access memory (DRAM), static random access memory (SRAM), electrically-erasable programmable read-only memory (EEPROM), read-only memory (ROM), and the like.

Ideally, the clock signal has sharp transition edges, i.e., the clock signal transitions from a low state to a high state quickly and transitions from a high state to a low state quickly. FIG. 1 illustrates one example of a preferred clock signal 100 that transitions from low-to-high within about 0.5-1.0 ns and transitions from high-to-low within about 0.5-1.0 ns. Shorter or longer times may be used for other applications. It is expected that the transition time will decrease as the size of the electronic devices decrease and processing speeds increase.

During testing, these electronic devices are often placed in a burn-in chamber or other test environments in which an external clock signal is provided to the electronic devices. The external clock signals are generally heavily loaded, causing the clock transitions to occur more slowly. It is not uncommon for an external clock signal to require 100 ns or more to transition from low-to-high and from high-to-low. This can be particularly troublesome when the system clock is designed to operate at faster rates, such as a 7.5 ns or a 2.5 ns clock for 133 MHz and 400 MHz designs, respectively.

Furthermore, to reduce the pin count required on the electronic device, clock signals are often compared to a reference voltage, such as $V_{dd}/2$ rather than a complementary voltage in testing modes. The reliance on a reference voltage makes the external clock, and thus the electronic device operations, more susceptible to noise. Noise is commonly caused by other electronic devices that are being tested in parallel.

For example, DRAM devices are frequently tested in groups wherein an external clock drives a plurality of DRAM devices. The heavy load on the external clock reduces the speed at which the external clock transitions from high-to-low and from low-to-high. Furthermore, the noise generated by the other DRAM devices being tested may cause noise on the external clock. The noise on the external clock frequently causes the clock to transition early. This is referred to as a slope reversal.

FIG. 2 illustrates one example of a problem that has been seen on an external clock signal 200. Preferably, the external clock signal 200 is compared to a reference voltage, indicated by dashed line 208. If the external clock signal 200 is above the reference voltage 208, then an internal clock signal is set high. If, on the other hand, the external clock signal 200 is below the reference voltage 208, then the internal clock signal is set low. Transitions from low-to-high and from high-to-low in about 100 ns are illustrated by the first three transitions. Noise on the external clock signal 200, however, may cause the external signal to transition prematurely, as illustrated by the slope reversals in region 210. When these slope reversals occur near the reference voltage 208, the clock may cycle from low-to-high or high-to-low in a time period significantly less than 100 ns. Shorter or longer transition times may be seen, and other slope reversals may occur at different times in the signal. These shorter cycle times may cause the device under test to fail.

Thus, there is a need for a device and a method of filtering a clock signal provided to an electronic device.

SUMMARY OF THE INVENTION

These and other problems are generally reduced, solved or circumvented, and technical advantages are generally achieved, by embodiments of the present invention, which provides an apparatus and a method of providing an external clock to an electronic device.

In one embodiment of the present invention, a clock filter for an electronic device is provided. The clock filter includes a clock receiver electrically coupled to an external clock and an enabling circuit electrically coupled to the clock receiver. The clock receiver generates an internal clock signal and the enabling circuit disables the clock receiver for a first time period after detecting a transition on the internal clock signal.

In another embodiment of the present invention, a clock filter for an electronic device includes a clock receiver electrically coupled to an external clock signal. The clock receiver generates an internal clock signal and a pulse generator, electrically coupled to the clock receiver, generates a pulse signal for a first time period after detecting a transition in the internal clock signal. An enabling circuit electrically coupled to the pulse generator and the clock receiver disables the clock receiver when the clock filter enable signal is enabled during the first time period.

In yet another embodiment of the present invention, a method of generating an internal clock signal is provided. This method includes the following steps, the order of which may vary: receiving an external clock signal, setting an internal clock signal high when the external clock signal is above a first threshold, setting the internal clock signal low when the external clock signal is below a second threshold; and maintaining the internal clock signal in a constant state for a first time period after the internal clock signal transitions from high-to-low or from low-to-high.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 is a timing diagram illustrating an operation of the state diagram of FIG. 8 in accordance with one embodiment of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the testing of a DRAM device. The invention may also be applied, however, to other electronic devices, such as other memory devices, processors, digital signal processors, access devices, and other electronic devices utilizing a clock signal.

It is further noted that, unless indicated otherwise, all functions described herein may be performed in either hardware or software, or some combination thereof. In a preferred embodiment, however, the functions are performed by hardware circuitry. The hardware circuitry is preferably integrated into the electronic device, but may comprise a separate electronic component electrically coupled to the electronic device.

Figure 1:
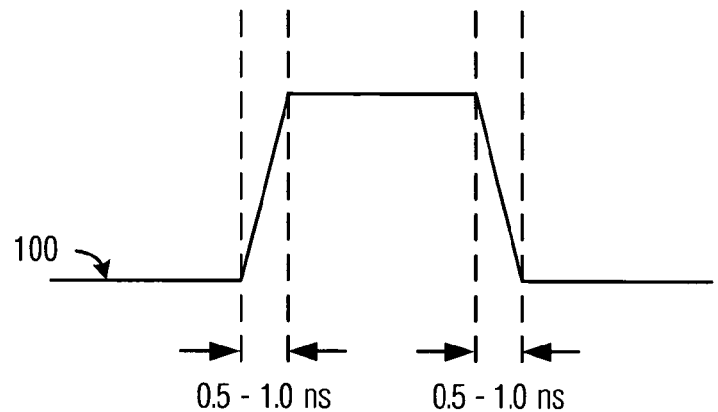
FIG. 1 illustrates an ideal clock signal.
Figure 2:
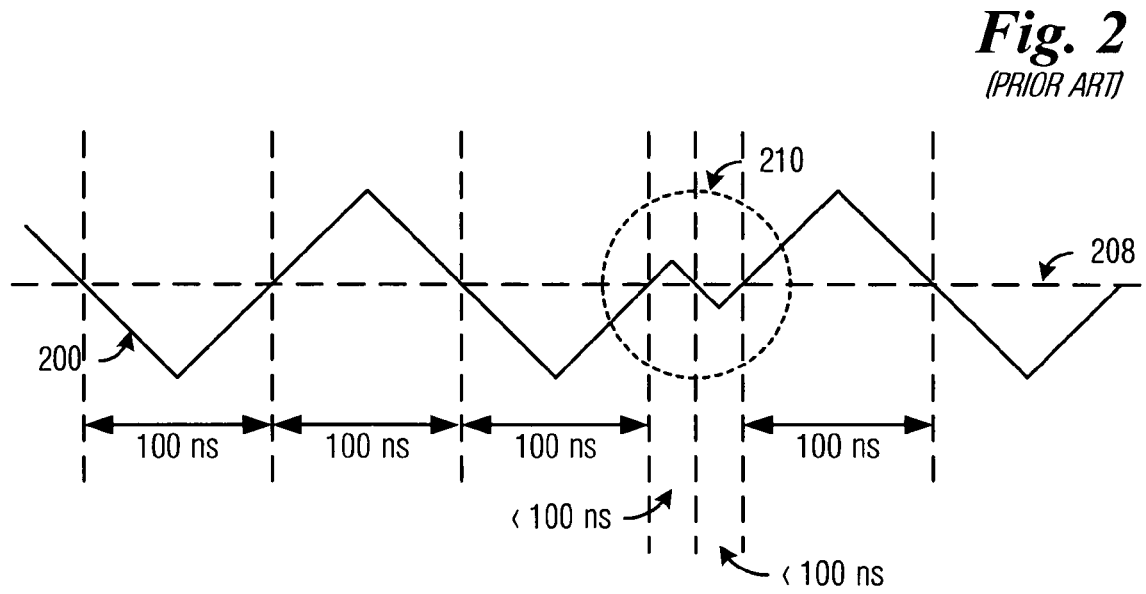
FIG. 2 illustrates a noisy clock signal.
Figures 3, 4:
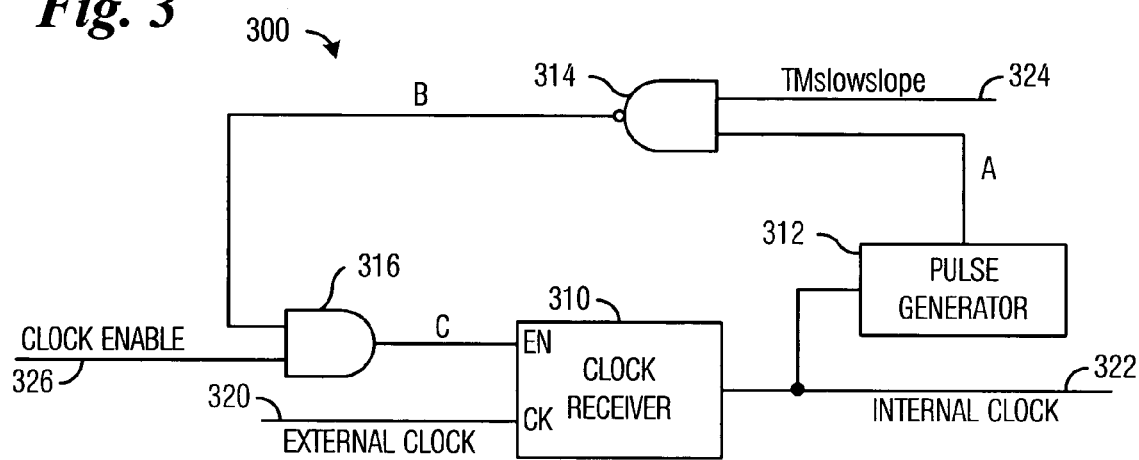
FIG. 3 is a block diagram of a first embodiment of a clock filter in accordance with one embodiment of the present invention.
FIG. 4 is a logic table illustrating values of signals included in the block diagram of FIG. 3 in accordance with one embodiment of the present invention.

Referring now to FIG. 3, a block diagram of a clock filter 300 that receives an external clock signal and filters the external clock signal to create an internal clock signal having acceptable transition times in accordance with one embodiment of the present invention is shown. The clock filter 300 comprises a clock receiver 310, a pulse generator 312, a NAND gate 314, and an AND gate 316. The clock receiver 310 is electrically coupled to the AND gate 316 such that the output of the AND gate 316 is communicated to an enable input (EN) of the clock receiver 310. The clock receiver 310 is further electrically coupled to an external clock signal 320, which represents the clock signal that is to be filtered. The external clock signal 320 may be, for example, a signal such as that illustrated in FIG. 2.

The clock receiver 310 is electrically coupled to the pulse generator 312 such that the clock receiver 310 communicates to the pulse generator 312 an internal clock signal 322. The internal clock signal 322 is further communicated to the electronic device (not shown) as a timing signal.

The pulse generator 312 is electrically coupled to the NAND gate 314 such that the output of the pulse generator 312 is an input signal to the NAND gate 314. Preferably, the pulse generator 312 generates a pulse signal approximately 5-10% of the duration of the external clock signal 320 transition. For example, in a situation in which the external clock signal 320 transitions from high-to-low and from low-to-high extends for about 100 ns as illustrated in FIG. 2, the pulse generator 312 preferably generates a pulse signal A of a duration of about 5 ns to about 10 ns, i.e., about 5-10% of 100 ns. Shorter or longer durations of the pulse signal A may be used.

The NAND gate 314 is further electrically coupled to a TMslowslope signal 324 such that the TMslowslope signal 324 is an input to the NAND gate 314. The TMslowslope signal 324 is an indicator of whether or not the clock filter 300 is to be operated in a test mode or a normal operations mode. In the preferred embodiment illustrated in FIG. 3, a TMslowslope signal 324 having a logical value of "1" causes the clock filter 300 to operate in a test mode, and a TMslowslope signal 324 having a logical value of "0" causes the clock filter 300 to operate in a normal operations mode.

The NAND gate 314 is further electrically coupled to the AND gate 316 such that the output of the NAND gate 314 is electrically coupled to an input to the AND gate 316. The AND gate 316 is further electrically coupled to a clock enable signal 326 such that the clock enable signal 326 is an input to the AND gate 316. The clock enable signal 326 disables the generation of the internal clock signal 322. It is desirable that the electronic device disable the clock, in some situations, such as, for example, as a power-on state, a power-savings state, and the like. In these situations, the clock enable signal 326 may be set low to disable the clock receiver and hold the internal clock signal 322 in a steady state.

The operation of the clock filter 300 will be discussed with reference to FIGS. 3 and 4. FIG. 4 is a logic table corresponding to the block diagram illustrated in FIG. 3, wherein signal A represents the pulse signal between the pulse generator 312 and the NAND gate 314, signal B represents the signal between the NAND gate 314 and the AND gate 316, and signal C represents the signal between the AND gate 316 and the clock receiver 310.

In operation, the external clock signal 320 is communicated to the clock receiver 310. If the clock receiver 310 is disabled, i.e., signal C is low, the clock receiver 310 preferably leaves the internal clock signal 322 in its current state. If, however, the clock receiver 310 is enabled, i.e., signal C is high, the clock receiver 310 compares the external clock signal 320 to a reference voltage or an inverted clock signal (not shown). Preferably, the reference voltage is about one-half of the constant voltage source ($V_{dd}$). If the external clock signal 320 is greater than the reference voltage, then the clock receiver 310 causes the internal clock signal 322 to be high, and if the external clock signal 320 is less than the reference voltage, then the clock receiver 310 causes the internal clock signal 322 to be low.

The internal clock signal 322 is communicated to the pulse generator 312 and the electronic device (not shown). Upon detecting a change in the internal clock signal 322, the pulse generator 312 generates a pulse, i.e., pulse signal A, of a predetermined duration, preferably 5-10% of the duration of the transition of the external clock signal 320 from high-to-low and from low-to-high. In the example discussed above in which the duration of the transition of the external clock signal 320 is about 100 ns, the pulse generator 312 generates a pulse of about 5 ns to about 10 ns. Shorter or longer durations may be used.

The pulse signal A generated by the pulse generator 312 is an input to the NAND gate 314. The other input to the NAND gate 314 is the TMslowslope signal 324, which causes the clock filter 300 to operate in a test mode. The output of the NAND gate 314 will be low when the TMslowslope signal 324 and the pulse signal A are high and will be low in all other circumstances.

The signal B is input to the AND gate 316. The other input to the AND gate 316 is the clock enable signal 326, which enables the internal clock. The output of the AND gate 316, i.e., signal C, is high when signal B and the clock enable signal 326 are both high, and low in all other circumstances. Thus, the clock receiver 310 is enabled when signal B and the clock enable signal 326 are both high.

As illustrated in FIG. 4, signal C is low whenever the clock enable signal 326 is low, causing the internal clock signal 322 to be held in a steady state. It should be noted that there are only two logic conditions for the situation when the clock enable signal 326 is low because when the clock enable signal 326 is low, the internal clock signal 322 maintains a steady state, and thus, a pulse signal A will not be generated. Accordingly, when the clock enable signal 326 is low, the TMslowslope signal 324 has no effect on the clock filter 300.

When the clock enable signal 326 is enabled, i.e., the clock enable signal 326 is set high, the clock receiver 310 is enabled and an internal clock signal 322 is generated in all logic conditions except when the TMslowslope signal 324 is high during the duration of the pulse signal A. In this situation, the output of the NAND gate 314, i.e., signal B, is low. Signal B is communicated to the AND gate 316, which causes the AND gate 316 to generate and communicate a low signal C to the clock receiver 310, thereby disabling the clock receiver 310 and causing the internal clock signal 322 to maintain its previous value for the duration of the pulse.

When pulse signal A generated by the pulse generator 312 or the TMslowslope signal 324 is low, signal B from the NAND gate 314 is high. The high signal B output from the NAND gate 314 is communicated to the input of the AND gate 316. When the clock enable signal 326 is high, the AND gate 316 will communicate a high signal C to the clock receiver 310, thereby enabling the clock receiver 310. Once enabled, the clock receiver 310 returns to comparing the external clock signal 320 to the reference voltage 208 and setting the internal clock signal 322 accordingly as described above.

As can be seen from the logic table 400 of FIG. 4, the clock receiver 310 is enabled when the clock enable signal 326 is high and both the TMslowslope signal 324 and signal B are not set simultaneously. The clock receiver 310 is preferably disabled in all other circumstances, thereby holding the internal clock signal 322 at a constant value.

Figures 5, 6:
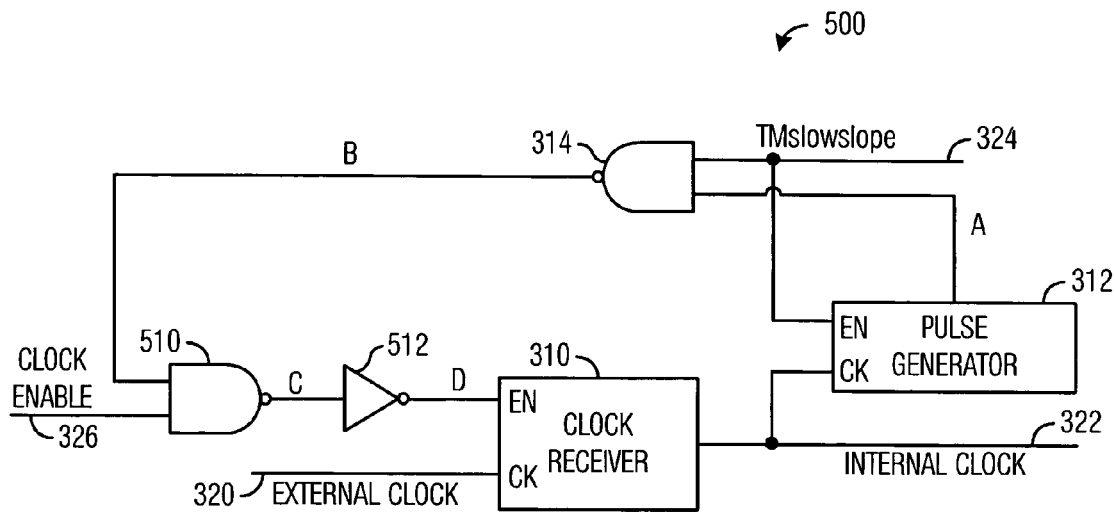
FIG. 5 is a block diagram of a second embodiment of a clock filter in accordance with one embodiment of the present invention.
FIG. 6 is a logic table illustrating values of signals included in the block diagram of FIG. 5 in accordance with one embodiment of the present invention.

FIGS. 5 and 6 illustrate a second embodiment of the present invention, wherein FIG. 5 illustrates a clock filter 500 and FIG. 6 illustrates a logic table 600 corresponding to the clock filter 500 of FIG. 5. The clock filter 500 is similar to the clock filter 300 of FIG. 3, wherein like reference numerals refer to like elements, except that the AND gate 316 of FIG. 3 has been replaced with a NAND gate 510 and an inverter 512. Furthermore, an enable (EN) line has been added to the pulse generator 312.

The enable line of the pulse generator is communicatively coupled to the TMslowslope signal 324. Accordingly, when the TMslowslope signal 324 is low, the pulse generator 312 is disabled and the output of the pulse generator, i.e., signal A, does not respond to changes in the internal clock. If, on the other hand, the TMslowslope signal 324 is high, then the pulse generator 312 is enabled and the output of the pulse generator will be pulsed as discussed above with reference to FIG. 3. The output of the NAND gate 314, i.e., signal B, of FIG. 5 is equivalent to signal B of FIG. 3, that is, signal B is low when TMslowslope signal 324 and signal A are both high and is high in all other circumstances. Thus, signal B being low indicates that the clock receiver 310 should be disabled.

The inputs of the NAND gate 510 are communicatively coupled to the NAND gate 314 and the clock enable signal 326. If both signal B and clock enable signal 326 are high, then the output of the NAND gate 510, i.e., signal C, is low. The inverter 512 inverts signal C to create signal D, which would be high. Thus, when the TMslowslope signal 324, signal A, and the clock enable signal 326 are all high, the clock receiver is disabled and the internal clock signal 322 is held constant for the duration of the pulse signal A.

It should be noted that the logic table illustrated in FIG. 6 does not contain the combination of the output of the pulse generator 312, i.e., signal A, being high when TMslowslope signal 324 is low. This combination is not seen in the clock filter 500 of FIG. 5 because the enable line of the pulse generator 312 is communicatively coupled to the TMslowslope signal 324. Thus, the pulse signal A may only be high when the pulse generator 312 is enabled by a high TMslowslope signal 324.

Figure 7:
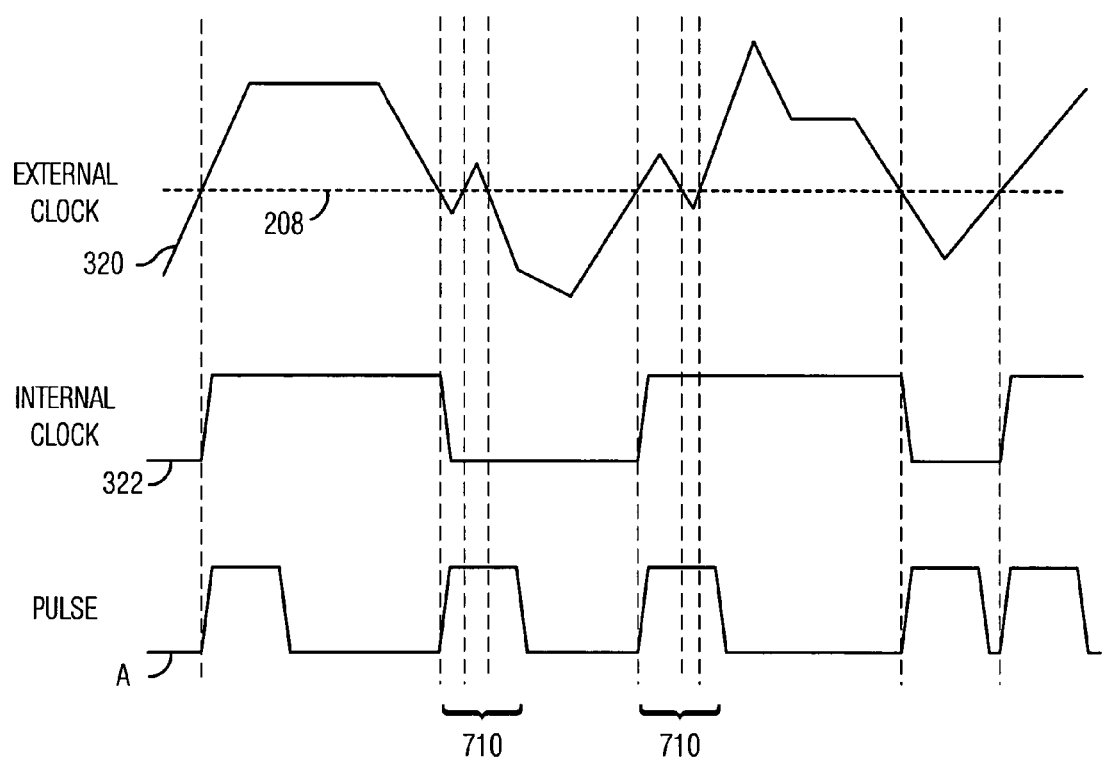
FIG. 7 is a timing diagram illustrating the function of a clock filter corresponding to the block diagrams of FIGS. 3 and 5 in accordance with one embodiment of the present invention.

FIG. 7 is a timing diagram illustrating the operation of the clock filter in accordance with one embodiment of the present invention, wherein the external clock signal 320 of FIG. 7 refers to the external clock signal 320 of FIGS. 3 and 5, the internal clock signal 322 of FIG. 7 refers to the internal clock signal 322 of FIGS. 3 and 5, and the pulse signal A refers to signal A generated by the pulse generator of FIGS. 3 and 5.

As illustrated in FIG. 7, the internal clock signal 322 is set high when the external clock signal 320 is above the reference voltage 208 and is set low when the external clock signal is below the reference voltage 208. However, the internal clock signal 322 is held constant when the pulse signal A is high.

As discussed above, the pulse signal A is set high for a predetermined amount of time after a transition of the internal clock signal 322 has been detected. When the pulse signal A is high, the internal clock signal 322 is held constant, thus preventing noise on the external clock signal 320 around the reference voltage 208 from affecting the internal clock signal 322.

For example, reference numerals 710 indicate regions in which noise on the external clock 320 caused a false slope reversal. Because the pulse signal A is high in regions 710, the internal clock signal 322 is held constant, causing the false slope reversals near the reference voltage 208 to be ignored.

As discussed above, the TMslowslope signal 324 enables and disables the clock filter 300 to be operated in a test mode. The TMslowslope signal 324 is preferably set and reset by an operator during testing operations. However, it is also preferable that the clock filter 300 is not easily enabled accidentally. For example, many times manufacturers fabricate memory devices, such as DRAMs, and test those devices prior to delivering those devices to the buyers. The buyers in turn frequently perform tests and configure the devices for a specific application. Accordingly, it is preferable that the manufacturer be able to easily enable the clock filter, but that the buyer would not easily be able to accidentally enable the clock filter.

Figure 8:
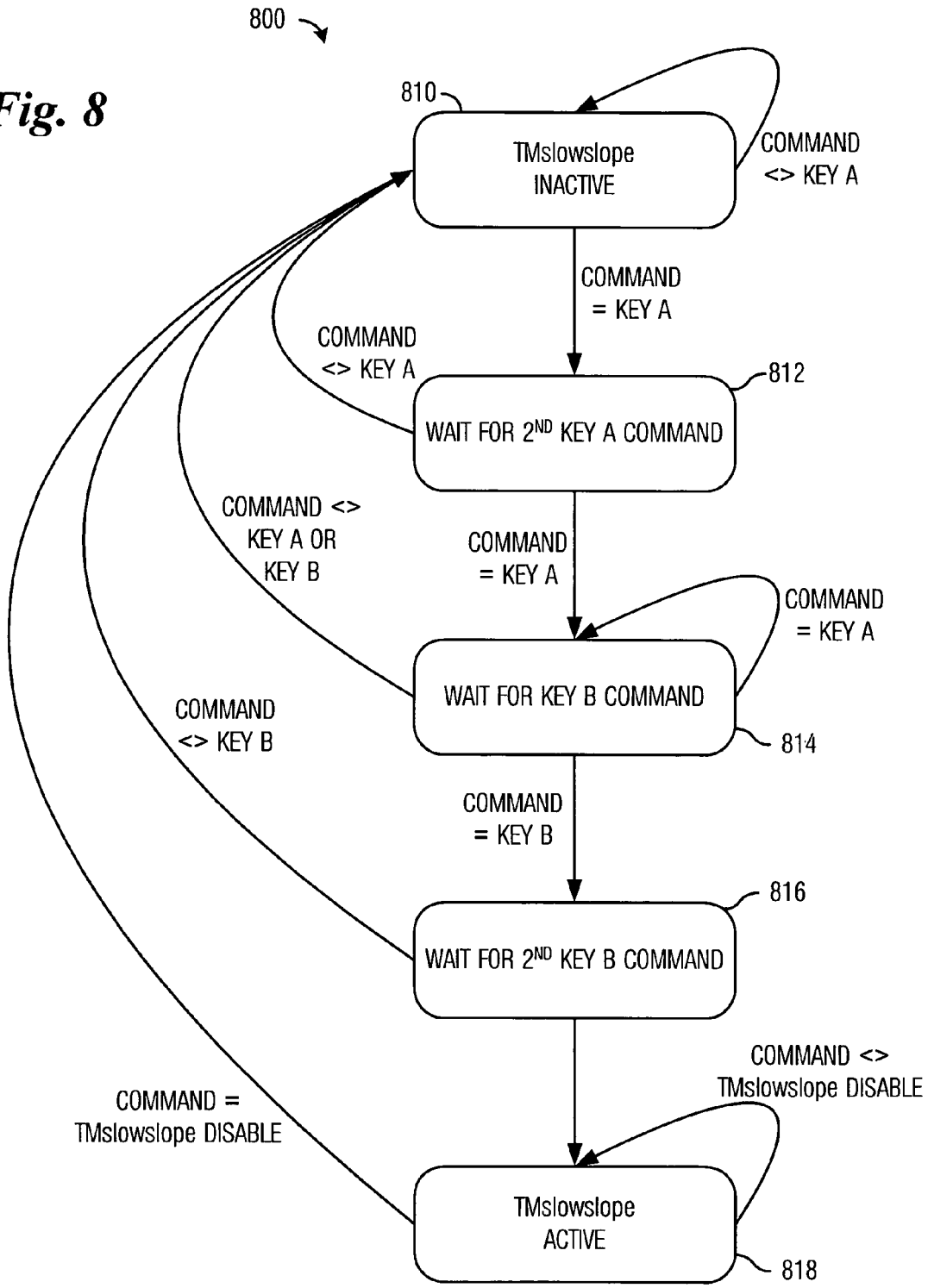
FIG. 8 is a state transition diagram to enable the clock filter in accordance with one embodiment of the present invention.

FIG. 8 illustrates a state transition diagram 800 for one method embodiment of the present invention which may be used to prevent the clock filter 300 (FIG. 3) from being enabled accidentally. The state transition diagram 800 begins in a "TMslowslope Inactive" state 810. In this state, the TMslowslope signal 324 (FIG. 3) is low, i.e., disabled. Accordingly, in the "TMslowslope Inactive" state 810, the clock filter 300 (FIG. 3) is disabled and the external clock signal 320 (FIG. 3) is passed through the clock receiver 310 (FIG. 3) and is used for the internal clock signal 322 (FIG. 3).

Preferably, the state transition diagram 800 changes states based upon commands entered by a test engineer. One common method of entering commands is through the use of mode register set (MRS) commands. The MRS commands generally comprise a key and an address combination. The MRS commands may include a bit to indicate whether a customer specific command or a vendor specific command is being selected. In accordance with a preferred embodiment of the present invention, the MRS commands are used to transition between states of the state transition diagram 800, thereby enabling the clock filter 300. For illustrative purposes only, the description contained herein generically refers to these commands as a "Key A" command and a "Key B" command. It should be noted, however, that other methods of entering commands may be used, and any suitable command or combination of commands may be used.

The state of the state transition diagram 800 remains in the "TMslowslope Inactive" state 810 until a specific command is entered. As illustrated in FIG. 8, if a specific command, indicated as "Key A" command, is entered, then the state transition diagram 800 transitions from the "TMslowslope Inactive" state 810 to a "Wait for $2^{nd}$ Key A command" state 812. For all other entered commands, the state transition diagram 800 remains in the "TMslowslope Inactive" state 810.

It has been found that using a sequence of single command entries has a higher likelihood of being accidentally entered by a customer. Accordingly, it is desirable to use a sequential command sequence that includes multiple entries of a single command to reduce the likelihood of a customer accidentally disabling the clock filter 300. In FIG. 8, this is illustrated by the "Wait for $2^{nd}$ Key A command" state 812, in which the state transition diagram 800 waits for a sequential command the same as the command used to enter the "Wait for $2^{nd}$ Key A command" state 812. Upon receiving the sequential command, the state transition diagram 800 transitions from the "Wait for $2^{nd}$ Key A command" state 812 to a "Wait for Key B command" state 814. It should be noted that if another command key is entered other than a second "Key A" command, the state transition diagram 800 transitions from the "Wait for $2^{nd}$ Key A command" state 812 back to the initial state "TMslowslope Inactive" state 810 and the clock filter 300 remains disabled.

To further reduce the likelihood of accidentally disabling the clock filter 300, it is preferred that the command sequence includes two or more different commands. In the embodiment illustrated in FIG. 8, a sequence of two commands are used to enable the clock filter 300, e.g., "Key A" and "Key B" commands. More or less commands may be used to enable the clock filter 300 within the scope of the present invention.

Furthermore, it should be noted that in the preferred embodiment, the state transition diagram 800 allows any number of "Key A" commands to be entered prior to the entry of a "Key B" command. This allows for noise and the accidental entry of additional "Key A" commands. Accordingly, the state transition diagram 800 remains in the "Wait for Key B command" state 814 until a command is received that is not equal to a "Key A" command or a "Key B" command. If additional "Key A" commands are received, the state transition diagram 800 remains in the "Wait for Key B command" state 814. If a command other than "Key A" or "Key B" is received, the state transition diagram 800 transitions back to the initial state of "TMslowslope Inactive" state 810, thereby preventing the clock filter 300 from being enabled accidentally.

Once a "Key B" command is entered, the state transition diagram 800 transitions from the "Wait for Key B command" state 814 to a "Wait for $2^{nd}$ Key B command" state 816. Similar to the preferred embodiment discussed above regarding receiving sequential "Key A" commands, it is also preferred that sequential "Key B" commands are required to be entered to enable the clock filter 300. Accordingly, the state transition diagram 800 transitions back to the initial state of "TMslowslope Inactive" state 810 if a command other than a "Key B" command is received, thereby preventing the clock filter 300 from being enabled accidentally. If, on the other hand, a sequential "Key B" command is entered, the state transition diagram 800 transitions from the "Wait for $2^{nd}$ Key B command" state 816 to a "TMslowslope Active" state 818.

Upon entry of the "TMslowslope Active" state 818, the TMslowslope signal 324 (FIG. 3) is set high, thereby enabling the clock filter 300. The clock filter 300 remains in an enabled state as long as the state transition diagram 800 remains in the "TMslowslope Active" state 818. As illustrated, the state transition diagram 800 remains in the "TMslowslope Active" state 818 until a "TMslowslope Disable" command is received. The "TMslowslope Disable" command may be any available command. Optionally, the "TMslowslope Disable" command may be a sequence of commands similar to that described above to enable the clock filter 300.

FIG. 9 illustrates the operation of the state diagram discussed above with reference to FIG. 8 in accordance with one embodiment of the present invention. To enter the test mode, "Key A" command is placed on the address bus (ADDR BUS). The "Key A" command is received on the transition of the external clock signal 320 from low-to-high, as indicated by the "Planned Key 'A'0 Entry #1" 910. Because the state diagram illustrated in FIG. 8 allows for two or more consecutive "Key A" commands, a preliminary slope reversal, such as that indicated by the dotted circle labeled 908 in FIG. 9, does not prevent entry into a testing state. Accordingly, an "Accidental Key 'A' Entry #1" 912 has no affect.

After a "Planned Key 'A' Entry #2" 914 has been entered by the user, the key command on the address bus changes to "Key B" command. Upon entry of the "planned 'Key B' #2" command 916, the test mode is entered.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention.

Although particular embodiments of the invention have been described in detail, it is understood that the invention is not limited correspondingly in scope, but includes all changes, modifications, and equivalents coming within the spirit and terms of the claims appended hereto. For example, different electronic devices may be used, different commands may be used, different command sequences may be used, and the like. Accordingly, it is understood that this invention may be extended to other structures and materials, and thus, the specification and figures are to be regarded in an illustrative rather than a restrictive sense.

What is claimed is:

1. A clock filter for an electronic device, the clock filter comprising:
   a clock receiver electrically coupled to an external clock; and
   an enabling circuit electrically coupled to the clock receiver;
   wherein the clack receiver generates an internal clock signal and the enabling circuit disables the clock receiver for a first time period after being triggered by a transition on the internal clock signal.

2. The clack filter of claim 1, wherein the enabling circuit includes a pulse generator.

3. The clock filter of claim 2, wherein the pulse generator is electrically coupled to the clock receiver, and the pulse generator generates a pulse signal having a duration substantially equivalent to the first time period.

4. The clock filter of claim 3, wherein the clock receiver is disabled when the pulse signal is high.

5. The clock filter of claim 1, wherein the enabling circuit is electrically coupled to a clock filter enable signal.

6. The clock filter of claim 5, wherein the enabling circuit disables the clock receiver when the clock filter enable signal is enabled.

7. A clock filter for an electronic device, the clock filter comprising:
   a clock receiver electrically coupled to an external clock signal, the clock receiver generating an internal clock signal;
   a pulse generator electrically coupled to the clock receiver, the pulse generator generating a pulse signal for a first time period upon being triggered by a transition in the internal clock signal; and
   an enabling circuit electrically coupled to the pulse generator and the clock receiver, the enabling circuit being electrically coupled to a clock filter enable signal and disabling the clock receiver for a duration of the first time period when the clock filter enable signal is enabled.

8. The clock filter of claim 7, wherein the enabling circuit is electrically coupled to a clock enable signal, the enabling circuit disabling the clock receiver when the clock enable signal is reset.

9. The clock filter of claim 7, wherein the enabling circuit includes:
   a NAND gate electrically coupled to the pulse generator and the clock filter enable signal; and
   an AND gate electrically coupled to the NAND gate such that the output of the NAND gate is a first input to the AND gate.

10. The clock filter of claim 9, wherein the AND gate has a second input electrically coupled to a clock enable signal.

11. The clock filter of claim 9, wherein an output of the AND gate is electrically coupled to the clock receiver.

12. The clock filter of claim 7, wherein the enabling circuit includes:
   a first NAND gate electrically coupled to the pulse generator and the clock filter enable signal;
   a second NAND gate electrically coupled to an output of the first NAND gate; and
   an inverter electrically coupled to an output of the second NAND gate, wherein the output of the inverter is electrically coupled to the clock receiver.

13. The clock filter of claim 12, wherein the second NAND gate has a second input electrically coupled to a clock enable signal.

14. The clock filter of claim 12, wherein the first NAND gate has a second input electrically coupled to a test mode enable signal.

15. The clock filter of claim 7, wherein the first time period is about 5% to about 10% of a transition period of the external clock signal.

16. A clock filter for an electronic device, the clock filter comprising:
   a clock receiver electrically coupled to an external clock signal and a clock receiver enable signal, the clock receiver generating an internal clock signal having a first pulse of a first duration;
   a pulse generator elect-rically coupled to the clock receiver to receive the internal clock signal, the pulse generator generating a second pulse signal for a second duration upon detecting a transition in the internal clock signal, the second duration being less than the first duration; and
   an enabling circuit electrically coupled to the pulse generator to receive the second pulse and electrically coupled to the clock receiver to provide the clock receiver enable signal, the enabling circuit further electrically coupled to a clock enable signal, the enabling circuit disabling the clock receiver via the clock receiver enable signal during the second duration if the clock enable signal is enabled.

17. The clock filter of claim 16, wherein the enabling circuit includes:
   a NAND gate electrically coupled to the pulse generator, the NAND gate receiving a clock filter enable signal and the second pulse as input; and
   an AND gate electrically coupled to the NAND gate such that an output of the NAND gate is a first input to the AND gate and a second input to the AND gate is the clock enable signal and an output of the AND gate is the clock receiver enable signal.

18. The clock filter of claim 16, wherein the enabling circuit includes:
   a first NAND gate electrically coupled to the pulse generator, the first NAND gate receiving a clock filter enable signal and the second pulse as input;
   a second NAND gate electrically coupled to the first NAND gate, the second NAND gate receiving an output of the first NAND gate and the clock enable signal as input; and
   an inverter electrically coupled to the second NAND gate, the inverter receiving an output of the second NAND gate as input and providing the clock receiver enable signal as output.

19. The clock filter of claim 16, wherein the second duration is about 5% to about 10% of the first duration.

20. The clock filter of claim 16, wherein the clock receiver maintains the internal clock signal as a substantially constant level when the clock receiver enable signal is disabled.

* * * * *

UNITED STATES PATENT AND TRADEMARK OFFICE
CERTIFICATE OF CORRECTION

PATENT NO. : 7,293,190 B2 Page 1 of 1
APPLICATION NO. : 10/720437
DATED : November 6, 2007
INVENTOR(S) : Vogelsang It is certified that error appears in the above-identified patent and that said Letters Patent is hereby corrected as shown below:

In Col. 9, line 8, delete "clack" and insert --clock--.
In Col. 9, line 12, delete "clack" and insert --clock--.
In Col. 10, line 18, delete "elect-rically" and insert --electrically--.

Signed and Sealed this

Fifteenth Day of April, 2008

JON W. DUDAS
*Director of the United States Patent and Trademark Office*